(12) United States Patent
Lüpke et al.

(10) Patent No.: US 6,396,752 B2
(45) Date of Patent: May 28, 2002

(54) METHOD OF TESTING A MEMORY CELL HAVING A FLOATING GATE

(75) Inventors: Jens Lüpke; Peter Pöchmüller, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/771,451

(22) Filed: Jan. 26, 2001

(30) Foreign Application Priority Data

Jan. 26, 2000 (DE) .......................................... 100 03 259

(51) Int. Cl.$^7$ ................................................. G11C 7/00
(52) U.S. Cl. .............. 365/201; 365/185.22; 365/185.27
(58) Field of Search ........................... 365/201, 185.27, 365/185.22

(56) References Cited

U.S. PATENT DOCUMENTS

| | | | |
|---|---|---|---|
| 5,155,701 A | 10/1992 | Komori et al. | 365/182 |
| 5,612,919 A * | 3/1997 | Arimoto | 365/201 |
| 5,930,185 A * | 7/1999 | Wendell | 365/201 |
| 5,953,271 A * | 9/1999 | Ooishi | 365/201 |
| 6,005,790 A * | 12/1999 | Chan et al. | 365/49 |
| 6,091,652 A | 7/2000 | Haehn et al. | 365/201 |

FOREIGN PATENT DOCUMENTS

| | | |
|---|---|---|
| EP | 0 017 808 A1 | 10/1980 |
| EP | 0 503 100 B 1 | 9/1992 |
| EP | 0 595 775 B 1 | 5/1994 |

* cited by examiner

Primary Examiner—Vu A. Le
Assistant Examiner—Tuan T. Nguyen
(74) Attorney, Agent, or Firm—Laurence A. Greenberg; Werner H. Stemer; Gregory L. Mayback

(57) ABSTRACT

The memory cells with floating gates are tested by applying voltage surges to the source or the drain of a selection transistor.

7 Claims, 2 Drawing Sheets

METHOD OF TESTING A MEMORY CELL HAVING A FLOATING GATE

BACKGROUND OF THE INVENTION

Field of the Invention

The invention lies in the field of memory technology and memory devices. More specifically, the present invention relates to a method for testing a memory cell having a selection transistor that is situated between a bit line and ground and that comprises a floating gate. The gate is connected to a data line via a blocking transistor that is connected to a word line at its gate.

Memory cells in which information is stored in the floating gate of the selection transistor are viewed today as a promising approach to realizing memory elements in the nanometer (nm) range. What are known as PLED (Planar Localized Electron Device) vertical transistors, which guarantee a good insulation of the floating gates of the selection transistors as a result of their excellent blocking characteristics, are preferably used for storage cells of this kind. In other words, PLED vertical transistors make possible the realization of non-volatile storage elements. Of course, this characteristic of the storage elements is also guaranteed by the good insulation of the floating gates by the gate oxide in the individual memory cells.

Although PLED vertical transistors or other transistors with sufficient blocking characteristics guarantee good insulation of the floating gates of the selection transistors, leakage currents can occur via the floating gates, which lead to a charge balance on the floating gate and thus at the storage point of the memory cell, i.e. to an information loss. In and of themselves, these leakage currents are generally very small and can usually be ignored. However, in a semiconductor memory that is constructed from memory cells of the above type, a test is nevertheless necessary in order to find weak memory cells whose leakage currents do not allow a sufficient data retaining characteristic. No method has been suggested hitherto which would make it possible to detect such memory cells whose data retaining characteristics were insufficient—i.e. "weak" memory cells—in a memory having locations of the type described above.

The above-noted problem will now be described in detail with reference to FIG. 3.

By activating a word line WL, a tunneling effect (cf. arrow TE) is controlled in a blocking transistor that is connected to the word line WL via gate G. The blocking transistor may be a PLED vertical transistor, for example. When the word line WL is active, a tunnel current can flow via a data line DL to a floating gate G2, which is otherwise insulated, of a selection transistor T2 that is connected to the word line WL by gate G1 and that is situated with its source-drain path S/D between a bit line BL and ground Gnd. Once the word line WL is disconnected, the charge on the floating gate G2 is trapped and should in theory remain there for an arbitrary length of time. By activating the bit line BL and by means of a corresponding reading system that is connected to the bit line BL, it is detected whether or not the selection transistor T2 is in the on state, in which current flows to ground. In other words, it is determined which information is stored at the gate G2.

In a test of a memory that is constructed of memory cells of that type, it is necessary to test whether, even over the long term, there is no draining of the charge to the data line DL via the blocking transistor, and thus no loss of information, when the word line WL is disconnected, i.e. gates G1 and G2 are disconnected. For reasons of cost alone, it must be possible to execute such a test for all locations of a memory in a short time, for instance in a few seconds, in order to be able to ensure the long-term reliability of these memory cells.

SUMMARY OF THE INVENTION

The object of the present invention is to provide a method of testing a memory cell comprising a floating gate which overcomes the above-noted deficiencies and disadvantages of the prior art devices and methods of this general kind, and which enables checking a large number of cells for reliability in a short time without substantial outlay.

With the above and other objects in view there is provided, in accordance with the invention, a memory cell testing method, which comprises:

providing a memory cell with a selection transistor having a floating gate disposed between a bit line and ground, and a blocking transistor connected between the floating gate of the selection transistor and a data line and having a gate connected to a word line;

in a test mode, applying voltage surges to one of the source, the drain, and a substrate of the selection transistor for generating disturbing couplings to the floating gate.

In accordance with an added feature of the invention, a plurality of memory cells are tested in parallel.

In accordance with an additional feature of the invention, the voltage surges are applied between the source and the drain of the selection transistor. In a preferred variant of the invention, the voltage surges are applied when the source-drain path is conductive, such that the voltage surges spread to the bit line connected to the corresponding memory cell.

In accordance with another feature of the invention, the voltage surges are applied to the substrate of the selection transistor.

With the above and other objects in view there is also provided, in accordance with the invention, a testing configuration for testing a memory cell having a selection transistor with source, a drain, and a floating gate disposed between a bit line and ground, the testing configuration comprising:

two MOS transistors of mutually different channel types connected in series and forming a connecting node;

said MOS transistors having gates and having source-drain paths connected between two potentials; and said connecting node between said MOS transistors being connected to one of the source and the drain of the selection transistor; and an inverter connected to said gates of said MOS transistors for receiving test mode signals.

In other words, the objects of the invention are achieved in a method as described above in that voltage surges are applied to the source, the drain, or the substrate of the selection transistor in a test mode for the purpose of generating disturbing couplings to the floating gate.

In the inventive method, to be able to find weak memory cells signals are applied to the selection transistor to sharply elevate the leakage currents from said weak memory cells. This is easily achieved by applying voltage surges to the source, the drain, or the substrate of the selection transistor, thereby giving rise to an oscillation of the voltage level.

In this process, a highly parallel test for the floating gates of a plurality of memory cells of a memory with respect to leakage current mechanisms is possible without further ado in that a common source voltage or substrate voltage is applied to the selection transistors of the memory cells. Specifically, in such a test the common substrate voltage or the common source voltage or the voltage at the bit line can be varied as a function of time.

In the inventive method, the test itself can be initiated by changing over to a corresponding mode. The generation of the voltage for the drain, source, or substrate of the selection transistor can be accomplished either on the chip of the memory itself or by applying an external voltage.

The identification of defective memory cells occurs in the test by a readout and evaluation of information that has been previously written into the memory, i.e. charge at the floating gates of the respective selection transistors locations.

The novel method thus makes possible a highly parallel, and thus effective, test for leakage current mechanisms between the insulated, i.e. floating, gate and the data line. This test can be realized by simple means, so that the equipment configuration required to execute the inventive method does not require a large additional outlay, as will be described in greater detail below.

Other features which are considered as characteristic for the invention are set forth in the appended claims.

Although the invention is illustrated and described herein as embodied in a method for testing a memory cell comprising a floating gate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Reference is had to the introductory text above, which contains a description of FIG. 3. Structurally and functionally equivalent components are identified with the same reference characters throughout the figures.

DESCRIPTION OF THE PREFERRED EMBODIMENTS

Figure 1:
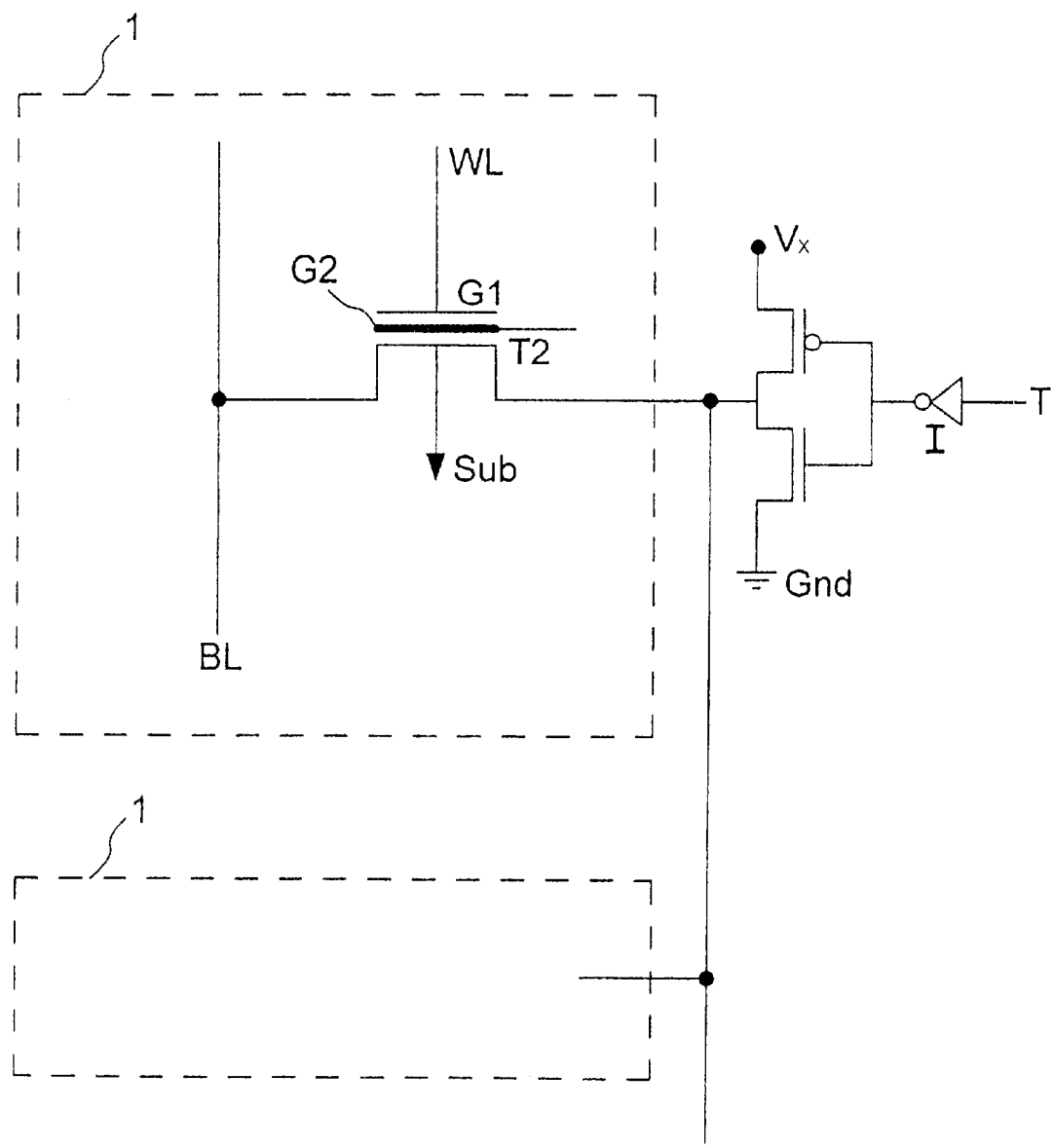
FIG. 1 is a diagram of a circuit configuration that is advantageous for carrying out the method according to the invention.
Figure 3:
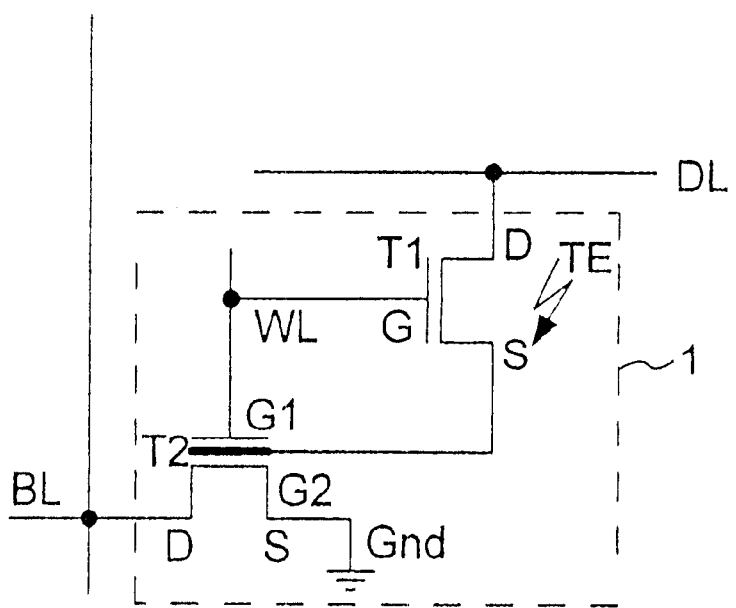
FIG. 3 is a schematic diagram of a memory cell to which the novel method can be applied.

In the inventive method, in order to generate disturbing couplings in a test mode voltage surges are applied to the selection transistor T2 (FIG. 3) at the floating gate G2—that is to say, when the word line WL is disconnected. These voltage surges can be applied to the source, drain, or substrate Sub of the selection transistor T2 (FIG. 1). The voltage surges can be a matter of pulses with the potentials ground Gnd and voltage Vx. The level and time characteristic of the voltage quantity depend on the technology used for the memory cell. But the level of the voltage must be selected so as not to damage the gate oxide of the tested transistors.

Referring now to FIG. 1 in detail, there is seen a circuit that is suitable for realizing the voltage pulses. The selection transistor T2 is connected to a test mode circuit that is composed of a series circuit of an n channel MOS transistor and a p channel MOS transistor between the potentials Vx and GND as well as an inverter I, to which corresponding test modes T are fed. A plurality of memory cells can be connected to this test circuit, as is schematically indicated in FIG. 1.

Thus, a parallel "bumping" of a large number of memory cells 1 can be performed, given a word line that is disconnected in the individual memory cells.

Other circuits can also be used for the parallel "bumping". What is important is solely that these circuits make it possible to supply an adjustable voltage in an oscillating manner instead of ground (FIG. 3) at the source terminal S of the selection transistor T2, for example.

It is particularly advantageous when a "1" is stored at the floating gate G2. The voltage surge then also spreads to the bit line BL and is thus active on the whole gate surface of the selection transistor T2. In this case, the bit lines of the individual memory cells should of course be cut off from other voltage connections by corresponding circuit elements.

To maximize the coupling between the floating gate and the source-drain path of the selection transistor T2, the transistor T2 should be conductive, so that the voltage impulse at the source terminal can spread over the entire surface beneath the gate G1 or G2, respectively, up to the drain terminal D. Alternatively, the substrate voltage can be pulsed, since the substrate extends surface-wide beneath the gate.

But it is also possible to generate a voltage surge in the substrate Sub of the selection transistor T2. Here, as well, a coupling to the insulated, i.e. floating, gate when the word line WL is disconnected can be achieved without further ado by a corresponding test mode.

Figure 2:
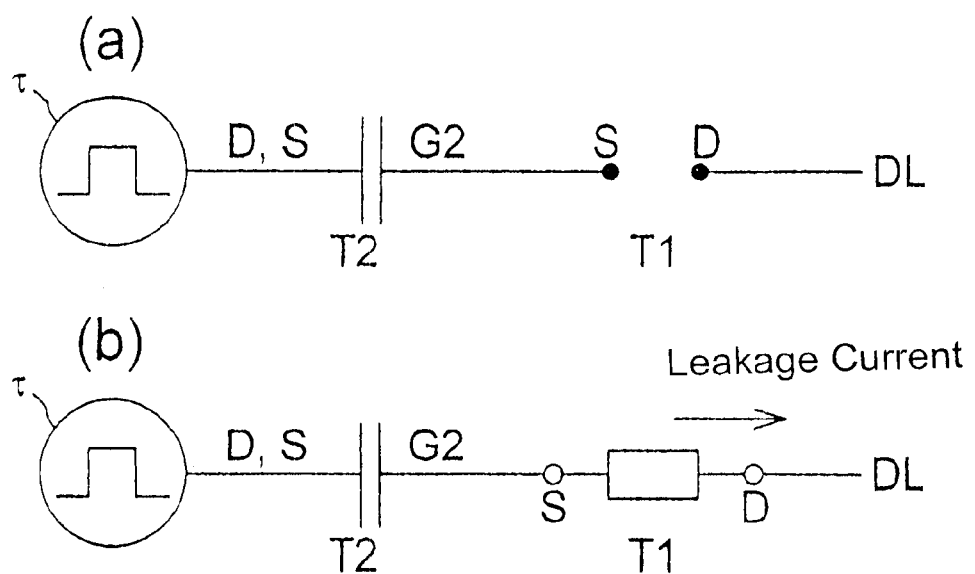
FIG. 2, subdivided into part (a) and part (b), illustrates equivalent circuit diagrams of a correct PLED transistor (a) and a faulty PLED transistor (b) in the circuit configuration of FIG. 1.

Referring now to FIG. 2, there are shown equivalent circuit diagrams with a correct PLED blocking transistor T1 (part (a) of FIG. 2) and a faulty PLED blocking transistor T1 (part (b) of FIG. 2), respectively. A leakage current mechanism occurs predominantly in the PLED transistor T1. The tunnel path, which is "conductive" to gate G of the transistor T1 only given a corresponding WL voltage, must be nonconductive when the PLED transistor T1 is deactivated. If this is not the case (FIG. 2(b)), then the charge at the floating gate G2 of the transistor T2 can be drained in the direction of the data line DL via the "permeable" or high-resistance tunnel path of the transistor T1 by the pumping on the source-drain path of the transistor T2 (other side of the capacitor in the equivalent circuit diagram).

We claim:

1. A memory cell testing method, which comprises:
providing a memory cell with a selection transistor having a floating gate disposed between a bit line and ground, and a blocking transistor connected between the floating gate of the selection transistor and a data line and having a gate connected to a word line;
in a test mode, applying voltage surges to one of the source, the drain, and a substrate of the selection transistor for generating disturbing couplings to the floating gate.

2. The method according to claim 1, which comprises testing a plurality of memory cells in parallel.

3. The method according to claim 1, which comprises applying the voltage surges between the source and the drain of the selection transistor.

4. The method according to claim 3, which comprises applying the voltage surges when the source-drain path is conductive, such that the voltage surges spread to the bit line connected to the corresponding memory cell.

5. The method according to claim 1, which comprises applying the voltage surges to the substrate of the selection transistor.

6. A testing configuration for testing a memory cell having a selection transistor with source, a drain, and a floating gate disposed between a bit line and ground, the testing configuration comprising:

two MOS transistors of mutually different channel types connected in series and forming a connecting node;

said MOS transistors having gates and having source-drain paths connected between two potentials; and said connecting node between said MOS transistors being connected to one of the source and the drain of the selection transistor; and an inverter connected to said gates of said MOS transistors for receiving test mode signals.

7. A memory cell testing method, which comprises:

providing a memory cell with a selection transistor having a source, a drain, and a floating gate disposed between a bit line and ground, and a blocking transistor connected between the floating gate of the selection transistor and a data line and having a gate connected to a word line; and connecting the testing configuration according to claim 6 to the selection transistor in a test mode, and applying voltage surges to one of the source, the drain, and a substrate of the selection transistor for generating disturbing couplings to the floating gate.

* * * * *